United States Patent [19]
Lin et al.

[11] Patent Number: 5,646,056
[45] Date of Patent: Jul. 8, 1997

[54] METHOD OF FABRICATING ULTRA-LARGE-SCALE INTEGRATION METAL-OXIDE SEMICONDUCTOR FIELD EFFECT TRANSISTOR

[75] Inventors: Chih-Hung Lin, Yi-Lan; Hwi-Huang Chen, Taipei; Gary Hong, Hsin-Chu, all of Taiwan

[73] Assignee: United Microelectronics Corp., Taiwan

[21] Appl. No.: 540,776

[22] Filed: Oct. 11, 1995

[51] Int. Cl.⁶ ............................................. H01L 21/265
[52] U.S. Cl. .............................. 437/40; 437/41; 437/57; 437/200; 437/34
[58] Field of Search .................... 437/40 GS, 41 GS, 437/57, 34, 200

[56] References Cited

U.S. PATENT DOCUMENTS

| | | | |
|---|---|---|---|
| 4,859,618 | 8/1989 | Shikata et al. | 437/41 GS |
| 4,978,629 | 12/1990 | Komori et al. | 437/40 GS |
| 4,992,388 | 2/1991 | Pfiester | 437/40 GS |
| 5,175,118 | 12/1992 | Yoneda | 437/40 GS |
| 5,196,357 | 3/1993 | Boardman et al. | 437/40 GS |
| 5,231,038 | 7/1993 | Yamaguchi et al. | 437/40 GS |
| 5,270,232 | 12/1993 | Kimura et al. | 437/40 GS |
| 5,296,727 | 3/1994 | Kawai et al. | 437/40 GS |
| 5,374,574 | 12/1994 | Kwon | 437/40 GS |
| 5,374,575 | 12/1994 | Kim et al. | 437/40 GS |
| 5,464,782 | 11/1995 | Koh | 437/41 GS |
| 5,466,615 | 11/1995 | Tsai | 437/41 GS |
| 5,489,543 | 2/1996 | Hong | 437/40 GS |

Primary Examiner—Charles L. Bowers, Jr.
Assistant Examiner—Lynne A. Gurley
Attorney, Agent, or Firm—Brumbaugh, Graves, Donohue & Raymond

[57] ABSTRACT

In a method for fabricating a ULSI MOSFET, an additional polysilicon layer is used to form polysilicon/metal compound metal contacts on source and drain regions and a gate so as to avoid leakage current and short channel effect problems.

10 Claims, 3 Drawing Sheets

METHOD OF FABRICATING ULTRA-LARGE-SCALE INTEGRATION METAL-OXIDE SEMICONDUCTOR FIELD EFFECT TRANSISTOR

FIELD OF THE INVENTION

The present invention relates to a method of forming an ultra-large-scale integration (ULSI) metal-oxide-semiconductor field effect transistor (MOSFET), especially to a method of forming a ULSI MOSFET which can prevent large leakage current and short channel effect.

BACKGROUND OF THE INVENTION

FIGS. 1a to 1d show the process of forming a conventional ULSI MOSFET. As shown in FIG. 1a, P well 10 is formed in a semiconductor substrate. Field oxide layer is formed to define the active region. Impurities are implanted to adjust the threshold voltage and to prevent punch through. Gate oxide 12 is then formed and gate 13 is deposited and defined. Impurities are implanted to form source region and drain region 11.

As shown in FIG. 1b, a silicon dioxide layer is deposited and then etched to form the gate sidewall spacer 14. As shown in FIG. 1c, a metal layer 15 of titanium or nickel is formed on the substrate with a thickness of about 400 to 600 angstrom. Then, a rapid thermal processing (RTP) step is performed so that the gate 13 and the source and drain regions 11 will form metal contacts with the metal layer 15 to prevent the sheet resistivity from being too large due to thin source and drain region 11. After that, a selective etching step is performed. Since the metal layer 15 will not react with the gate sidewall spacer 14, the metal is removed by using an etchant for etching metals. The metal silicide layers 16, i.e. the metal contacts, formed on the gate and the source and drain regions 13, 11 in the rapid thermal process are shown in FIG. 1d. Another rapid thermal process could be performed after the metal layer 15 is removed to further reduce the sheet resistivity.

However, the ULSI MOSFET element produced according to the above procedure has some deficiencies. Since the thickness of the drain and source regions 11 is small, it will be reduced due to the formation of the metal silicide layer 16, and thus, the thickness of the residual drain and source regions will be difficult to control. If the residual drain and source regions are too thin, the leakage current will be too large, and even short circuit may occur. If the residual drain and source regions are too thick, a short channel effect may happen.

SUMMARY OF THE INVENTION

It is therefore an object for the present invention to eliminate the shortcomings of leakage current, short channel effect and short circuit of a conventional ULSI MOSFET.

The object of the present invention is fulfilled by providing a method for fabricating a ULSI MOSFET on a semiconductor substrate of a first type. The method comprises the following steps of: forming a well region of the first type in the substrate; depositing a polysilicon layer; forming a heavily doped region of a second type in the substrate; the polysilicon layer being the reactive layer of the MOSFET when forming metal silicide; coating a photoresist to define a gate region; etching the polysilicon layer and the heavily doped region of the second type to form source and drain regions; removing the photoresist; forming a gate oxide layer; depositing a polysilicon gate layer; depositing and defining a gate photoresist; forming a gate electrode by etching the polysilicon gate layer; forming gate sidewall spacers beside the gate electrode by depositing an dielectric layer and etching the dielectric layer; depositing a metal layer; performing a rapid thermal process so that the metal layer will react with the polysilicon layer to form silicides; and selectively etching residual of the metal layer to form gate, source and drain electrode metal silicide contact faces.

BRIEF DESCRIPTION OF THE DRAWING

The present invention will be more fully understood from the detailed description given hereinafter with reference to and the accompanying drawings which are given by way of illustration only, and thus are not limitative of the present invention and wherein.

DETAILED DESCRIPTION OF THE PREFERRED EMBODIMENT

An embodiment of the present invention is applied to a semiconductor substrate to fabricate a ULSI N type MOSFET according to the present invention as illustrated in FIGS. 2 to 7 and described hereinafter.

Figure 1A:
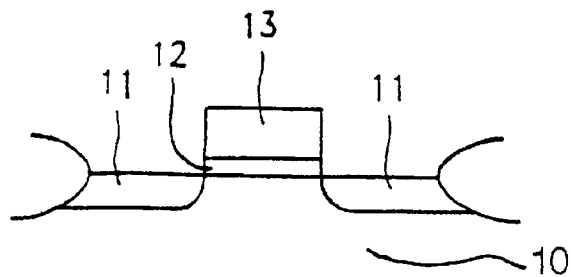
FIGS. 1a to 1d show cross-sectional views of the conventional ULSI MOSFET.
Figure 1B:
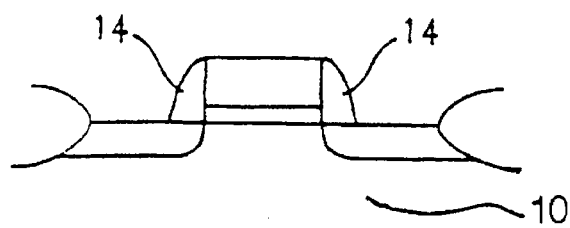
Figure 1C:
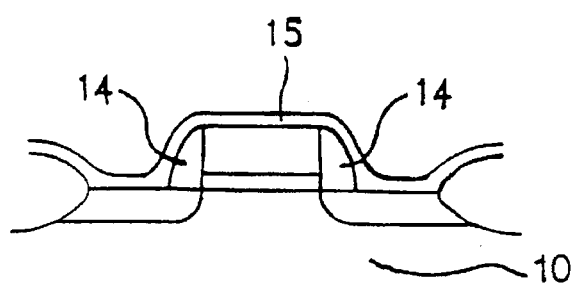
Figure 1D:
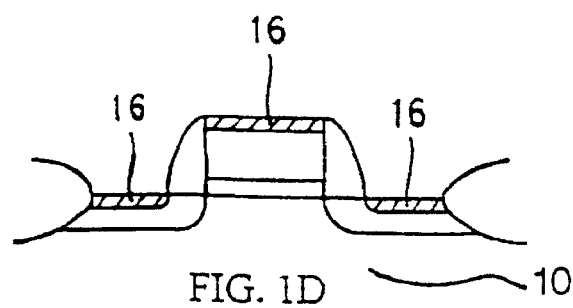
Figure 2:
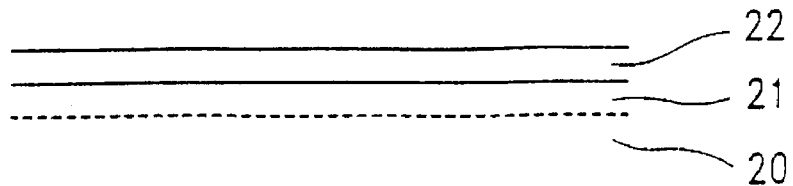
FIGS. 2 to 7 show cross-sectional views of the ULSI MOSFET according to the present invention.

As shown in FIG. 2, the first step is to form a P well 20 in the semiconductor substrate. The second step is to form field oxides to define active regions. The third step is to form an N type heavily doped region 21 by implanting N type impurities, and a polysilicon layer 22 is deposited on the substrate. Usually, the thickness of the heavily doped region 21 is between 0.05 and 0.20 µm, and the thickness of the polysilicon layer 22 is between 500 to 1500 angstrom. This step could also be done by depositing a polysilicon layer 22 and implanting phosphorous or arsenic into the polysilicon layer 22, or doping with $POCl_3$ at 800° to 850° C. The substrate must be subsequently treated at 800° to 850° C. to diffuse the impurities to predetermined depth of 0.05 to 0.20 µm. The density of impurities in the heavily doped region should be between $1 \times 10^{19}$ to $1 \times 10^{21}/cm^3$.

Figure 3:
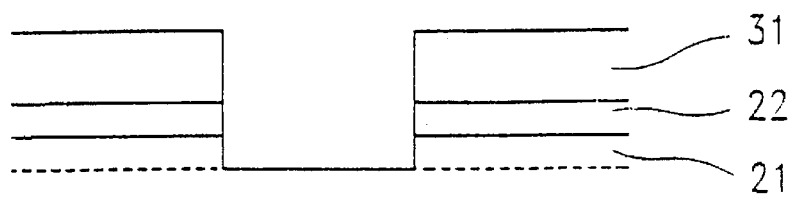

As shown in FIG. 3, the fourth step is to coat a photoresist 31 on the polysilicon layer 22 and define a grooved gate. The fifth step is to etch the polysilicon layer 22 and the N type heavily doped region 21. Then, the sixth step is to implant impurities to adjust the threshold voltage of the MOSFET and to prevent punch through. The seventh step is to remove the photoresist 31.

Figure 4:
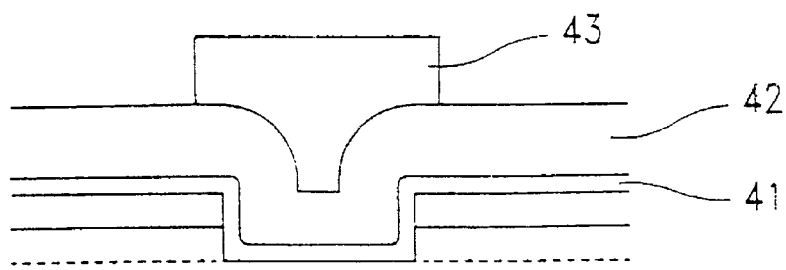
Figure 5:
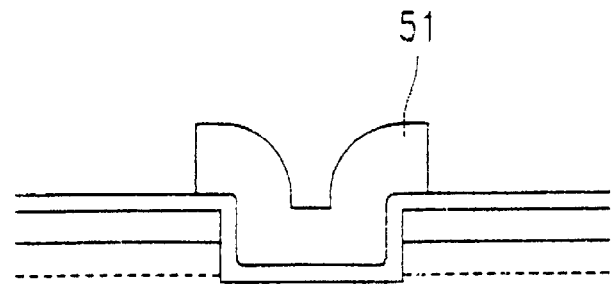

As shown in FIG. 4, step 8 is to form gate oxide layer 41. Step 9 is to deposit a polysilicon layer 42. Step 10 is to coat a photoresist 43 and define its pattern. The photoresist 43 is used to define a polysilicon gate. As shown in FIG. 5, step 11 is to etch the polysilicon layer 42 to form the polysilicon gate 51. Step 12 is to remove the photoresist 43.

Figure 6:
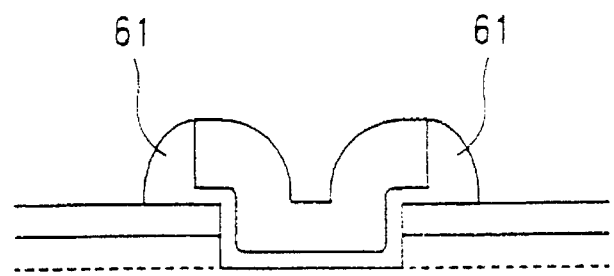

As shown in FIG. 6, step 13 is to deposit a silicon dioxide layer. Step 14 is to etch the silicon dioxide layer by dry etching to form gate sidewall spacers 61.

Figure 7:
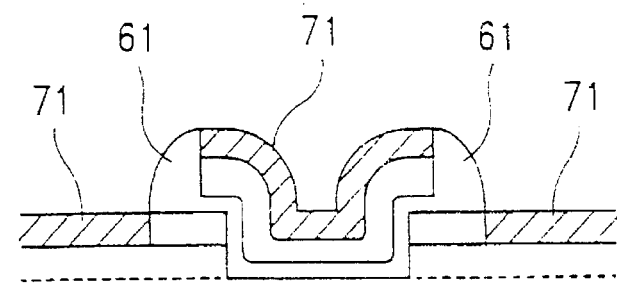

As shown in FIG. 7, step 15 is to deposit a metal layer. The metal could be Ti or Ni. The thickness of the metal layer could be between 400 to 600 angstrom. Step 16 is a rapid thermal process at about 600° to 800° C. The metal layer will react with silicon to form polysilicon/metal compounds on the gate and the source and drain regions. In this embodiment, the polysilicon/metal compounds is silicide.

Since metal do not react with silicon dioxide, there is no polysilicon/metal compound formed on the gate sidewall spacers 61. Step 17 is to remove the metal using an etchant to selectively etch the metal. The etchant contains mixed $H_2O$, $H_2O_2$, and $NH_4OH$ at a ratio of 5:1:1. After that, the N type MOSFET according to the present invention is finished as shown in FIG. 7. The polysilicons on the gate and the source and drain regions have formed polysilicon/metal compounds 71, i.e. silicides, with the metal to reduce the sheet resistivity.

As stated above, in the present invention, a polysilicon layer is formed on the source and drain regions and then forms polysilicon/metal compounds to become metal contacts. Therefore, the thickness of the source and drain regions will not be reduced due to metal contact formation. As a result, the thickness of the source and drain regions could be controlled to prevent the deficiencies of conventional ULSI MOSFET, such as leakage current and short channel effect.

It should be noted that the present invention can be applied to either a P type substrate or an N type substrate. Since the interchange of P type and N type is well known to those skilled in the art, this is not further discussed hereinafter.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of forming a transistor in and on a substrate having a well region therein, said method comprising the steps of:

forming a polysilicon layer on the well region;

heavily implanting ions into said polysilicon layer, the conductivity of said ions being opposite to the conductivity of the well region;

diffusing said ions further into an upper portion of said well region to form a heavily doped layer;

forming a first photoresist layer on the polysilicon layer, a pattern of said first photoresist layer defining a gate region;

removing portions of said heavily doped layer and said polysilicon layer using said first photoresist layer as a mask;

forming a gate oxide layer on the polysilicon layer and the heavily doped layer;

forming a gate polysilicon layer on the gate oxide layer;

forming a second photoresist layer on the gate polysilicon layer, a pattern of said second photoresist layer covering the gate region;

removing portions of said gate polysilicon layer using said second photoresist layer as a mask;

forming a dielectric layer on the gate polysilicon layer and the gate oxide layer;

etching portions of the dielectric layer and the gate oxide layer until the gate polysilicon layer and the polysilicon layer are exposed, thereby forming spacers on the side walls of the gate polysilicon layer and the gate oxide layer;

forming a metal layer on the gate polysilicon layer, the spacers and the polysilicon layer; and reacting the polysilicon layer and the gate polysilicon layer with the metal layer, thereby forming a plurality of silicides in an upper portion of said gate polysilicon layer, and upper portions of said polysilicon layer not covered by the spacers.

2. The method according to claim 1, wherein the conductivity of the well region is P type and the conductivity of the ions is N type.

3. The method according to claim 1, wherein said ions comprise $POCl_3$.

4. The method according to claim 1, wherein said dielectric layer is a member selected from the group consisting of silicon oxide and silicon nitride.

5. The method according to claim 1, wherein said metal layer is a member selected from the group consisting of Ti and Ni.

6. A method of forming a transistor in and on a substrate having a well region therein, said method comprising the steps of:

heavily implanting ions into said well region to form a heavily doped layer in an upper portion of the well region, the conductivity of said ions being opposite to the conductivity of the well region;

forming a polysilicon layer on the well region;

forming a first photoresist layer on the polysilicon layer, a pattern of said first photoresist layer defining a gate region;

removing portions of said heavily doped layer and said polysilicon layer using said first photoresist layer as a mask;

forming a gate oxide layer on the polysilicon layer and the heavily doped layer;

forming a gate polysilicon layer on the gate oxide layer;

forming a second photoresist layer on the gate polysilicon layer, a pattern of said second photoresist layer covering the gate region;

removing portions of said gate polysilicon layer using said second photoresist layer as a mask;

forming a dielectric layer on the gate polysilicon layer and the gate oxide layer;

etching portions of the dielectric layer and the gate oxide layer until the gate polysilicon layer and the polysilicon layer are exposed, thereby forming spacers on the side walls of the gate polysilicon layer and the gate oxide layer;

forming a metal layer on the gate polysilicon layer, the spacers and the polysilicon layer; and reacting the polysilicon layer and the gate polysilicon layer with the metal layer, thereby forming a plurality of silicides in an upper portion of said gate polysilicon layer, and upper portions of said polysilicon layer not covered by the spacers.

7. The method according to claim 6, wherein the conductivity of the well region is P type and the conductivity of the ions is N type.

8. The method according to claim 6, wherein said dielectric layer is a member selected from the group consisting of silicon oxide and silicon nitride.

9. The method according to claim 6, wherein said metal layer is a member selected from the group consisting of Ti and Ni.

10. A method of forming a transistor in and on a substrate having a well region therein, said method comprising the steps of:

forming a doped polysilicon layer on the well region, wherein said doped polysilicon layer comprises ions, and wherein the conductivity of the doped polysilicon layer is opposite to the conductivity of the well region;

diffusing said ions further into an upper portion of said well region to form a heavily doped layer;

forming a first photoresist layer on the doped polysilicon layer, a pattern of said first photoresist layer defining a gate region;

removing portions of said heavily doped layer and said doped polysilicon layer using said first photoresist layer as a mask;

forming a gate oxide layer on the doped polysilicon layer and the heavily doped layer;

forming a gate polysilicon layer on the gate oxide layer;

forming a second photoresist layer on the gate polysilicon layer, a pattern of said second photoresist layer covering the gate region;

removing portions of said gate polysilicon layer using said second photoresist layer as a mask;

forming a dielectric layer on the gate polysilicon layer and the gate oxide layer;

etching portions of the dielectric layer and the gate oxide layer until the gate polysilicon layer and the doped polysilicon layer are exposed, thereby forming spacers on the side walls of the gate polysilicon layer and the gate oxide layer;

forming a metal layer on the gate polysilicon layer, the spacers and the doped polysilicon layer; and reacting the doped polysilicon layer and the gate polysilicon layer with the metal layer, thereby forming a plurality of silicides in an upper portion of said gate polysilicon layer, and upper portions of said doped polysilicon layer not covered by the spacers.

* * * * *